US011183465B2

United States Patent
Otsubo

(10) Patent No.: US 11,183,465 B2
(45) Date of Patent: Nov. 23, 2021

(54) RADIO-FREQUENCY MODULE

(71) Applicant: Murata Manufacturing Co., Ltd., Kyoto (JP)

(72) Inventor: Yoshihito Otsubo, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 38 days.

(21) Appl. No.: 16/558,531

(22) Filed: Sep. 3, 2019

(65) Prior Publication Data

US 2019/0393166 A1  Dec. 26, 2019

Related U.S. Application Data

(63) Continuation of application No. PCT/JP2018/008679, filed on Mar. 7, 2018.

(30) Foreign Application Priority Data

Mar. 8, 2017 (JP) .............................. JP2017-044067

(51) Int. Cl.
*H01L 23/552* (2006.01)
*H01L 23/31* (2006.01)
(Continued)

(52) U.S. Cl.
CPC ........ *H01L 23/552* (2013.01); *H01L 23/3121* (2013.01); *H01L 23/5383* (2013.01); *H01L 25/0655* (2013.01); *H01L 25/18* (2013.01)

(58) Field of Classification Search
None
See application file for complete search history.

(56) References Cited

U.S. PATENT DOCUMENTS 10,772,244 B2 * 9/2020 Otsubo .................. H01L 23/66
2009/0236700 A1 * 9/2009 Moriya ................... H01L 23/29
257/659
(Continued)

FOREIGN PATENT DOCUMENTS

JP          2012-19091 A    1/2012
JP          5276169 B2      8/2013
(Continued)

OTHER PUBLICATIONS

International Search Report for International Application No. PCT/JP2018/008679 dated May 22, 2018.
(Continued)

*Primary Examiner* — Long Pham
(74) *Attorney, Agent, or Firm* — Pearne & Gordon LLP

(57) ABSTRACT

A radio-frequency module having high design flexibility of a shield with less likelihood of variation in shielding characteristics is provided. A radio-frequency module includes a multilayer circuit board, a component mounted on a top surface of the multilayer circuit board, and a plurality of metal pins having a bent shape such that both end portions can be connected to the top surface of the multilayer circuit board. Each of the plurality of metal pins is provided upright on the top surface of the multilayer circuit board in a state where both end portions are connected to the top surface of the multilayer circuit board, and is arranged near the component to make up a shield member.

17 Claims, 9 Drawing Sheets

(51) Int. Cl.
  *H01L 23/538*    (2006.01)
  *H01L 25/065*    (2006.01)
  *H01L 25/18*     (2006.01)

(56) References Cited

U.S. PATENT DOCUMENTS

| | | | |
|---|---|---|---|
| 2011/0084378 A1* | 4/2011 | Welch | H01L 23/3121 |
| | | | 257/692 |
| 2012/0008288 A1* | 1/2012 | Tsukamoto | H01L 24/97 |
| | | | 361/736 |
| 2015/0131231 A1 | 5/2015 | Yoo et al. | |
| 2018/0092257 A1* | 3/2018 | Otsubo | H01L 23/18 |
| 2018/0108624 A1* | 4/2018 | Hsu | H01L 23/3128 |
| 2018/0166394 A1* | 6/2018 | Otsubo | H01L 21/4857 |
| 2018/0204781 A1* | 7/2018 | Otsubo | H01L 23/16 |
| 2018/0308627 A1* | 10/2018 | Kato | H01F 41/0206 |

FOREIGN PATENT DOCUMENTS

| | | |
|---|---|---|
| WO | 2008/093414 A1 | 8/2008 |
| WO | 2016/181954 A1 | 11/2016 |
| WO | 2017/026430 A1 | 2/2017 |

OTHER PUBLICATIONS

Written Opinion for International Application No. PCT/JP2018/008679 dated May 22, 2018.

* cited by examiner

RADIO-FREQUENCY MODULE

This is a continuation of International Application No. PCT/JP2018/008679 filed on Mar. 7, 2018 which claims priority from Japanese Patent Application No. 2017-044067 filed on Mar. 8, 2017. The contents of these applications are incorporated herein by reference in their entireties.

BACKGROUND

Technical Field

The present disclosure relates to a radio-frequency module including a shield.

Various radio-frequency modules are mounted on a mother board of an electronic device, such as a communication terminal device. In some of radio-frequency modules of this type, components mounted on a circuit board are sealed by a sealing resin layer. To shield components against noise, the surface of the sealing resin layer may be coated with a shield film. When a plurality of components is mounted on a circuit board, there can be a case where only a designated component(s) is/are intended to be shielded against noise; however, it is difficult for a shield film that coats the surface of the sealing resin layer to shield only the designated component(s), so design flexibility is low. For this reason, a radio-frequency module in which a shield member can be disposed with high design flexibility has been suggested. For example, as shown in FIG. 16, in a radio-frequency module 100 described in Patent Document 1, a component 102 is mounted on a circuit board 101. Bonding wires 103 are disposed around the component 102, and the component 102 is shielded by the bonding wires 103. With this configuration, the bonding wires 103 just need to be mounted only around a portion that requires shielding, so the design flexibility of the shield member improves.

Patent Document 1: Japanese Patent No. 5276169 (see paragraphs 0021 to 0024, FIG. 3, and others)

BRIEF SUMMARY

In the existing radio-frequency module 100, shielding is provided by arranging a loop of the bonding wire 103 at predetermined intervals. However, the bonding wires 103 are easy to deform. Therefore, when the sealing resin layer 104 is formed, the bonding wire(s) 103 may deform to contact the component 102 and, as a result, the component 102 or the bonding wire(s) 103 may become damaged. When a distance is increased between the component 102 and each of the bonding wires 103 to prevent contact between the component 102 and each bonding wire 103, the increased distance interferes with high-density mounting. When the bonding wire(s) 103 deforms, the space between the bonding wire(s) 103 and the adjacent bonding wire 103 varies or the connection space between the damaged bonding wire(s) 103 and a shield film at a top varies, so shielding characteristics may vary.

The present disclosure provides a radio-frequency module that has high design flexibility of a shield member and whose shielding characteristics are hard to vary.

A radio-frequency module of the present disclosure includes a circuit board, a component mounted on one of main surfaces of the circuit board, and a plurality of metal pins, each having a first extended portion, a second extended portion, and a third extended portion, one end surface of the first extended portion being connected to an electrode formed on the one of the main surfaces of the circuit board, the first extended portion being extended from the one end surface away from the one of the main surfaces, the second extended portion being bent and extended from the first extended portion at an end opposite from the one end surface, the third extended portion being bent and extended from the second extended portion at an end opposite from the end extended from the first extended portion to approach the one of the main surfaces. The plurality of metal pins is disposed near the component to make up a shield member.

With this configuration, the plurality of metal pins is disposed near the component to make up a shield member, so the design flexibility of the shield member is improved as compared to the configuration in which a shield film that coats the surface of a sealing resin layer is provided. Since the shield member is made up of the metal pins that are harder and less prone to deform than bonding wires, for example, inconvenience that, when the sealing resin layer is formed, the metal pins deform to contact the component is prevented. Since the metal pins are less prone to deform, the distance between the component and each of the metal pins need not be increased to prevent contact with the component unlike the case where the shield member is made up of bonding wires, so high-density mounting is easy. The space between any adjacent metal pins is also more easily maintained because the metal pins are less prone to deform, so the shielding characteristics become stable. The metal pins can be widened as compared to bonding wires, so a shield resistance can be reduced, and shielding characteristics improve.

The plurality of metal pins may be connected to a ground electrode.

With this configuration, the shielding characteristics of the shield member improve.

The plurality of metal pins may be arranged around the component so as to surround the component when viewed in a direction perpendicular to the one of the main surfaces of the circuit board.

With this configuration, since the plurality of metal pins is arranged so as to surround the component, the plurality of metal pins can be used to function as the shield member that protects the component against noise.

Each of the plurality of metal pins may be formed such that a space between the first extended portion and the third extended portion is greater than a width of the component and may be arranged in a state where the metal pin straddles over the component.

With this configuration, since the plurality of metal pins is arranged in a state where the metal pin straddles over the component, the plurality of metal pins can be used to function as the shield member that protects the component against noise. In addition, since the metal pins straddle over the component, the shielding characteristics improve.

The radio-frequency module may further include a sealing resin layer sealing the component. The sealing resin layer may have a contact surface that contacts the one of the main surfaces of the circuit board, a facing surface facing the contact surface, and a side surface connecting an edge of the contact surface and an edge of the facing surface. The plurality of metal pins may be partially exposed at the facing surface of the sealing resin layer.

With this configuration, for example, when the surface of the sealing resin layer is coated with a shield film, the shield film and the metal pins can be easily connected. When the metal pins are connected to the ground electrode of the circuit board, grounding of the shield film is easily performed.

The radio-frequency module may further include a sealing resin layer having a contact surface that contacts the one of the main surfaces of the circuit board, a facing surface facing the contact surface, and a side surface connecting an edge of the contact surface and an edge of the facing surface, the sealing resin layer sealing the component and the plurality of metal pins. The plurality of metal pins may be not exposed from the facing surface of the sealing resin layer.

With this configuration, for example, when the metal pins are arranged so as to straddle over the component, a distance (a distance in a thickness direction of the sealing resin layer) between the component and the metal pins can be reduced, so the shielding characteristics of the metal pins for the component improve.

Each of the plurality of metal pins may be coated with an electrically insulating material.

With this configuration, contact between the component and each of the metal pins is reliably prevented. Thus, narrow gap arrangement of the component and each metal pin is possible, so the mounting density of components improve.

The radio-frequency module may further include a shield film coating at least the facing surface and side surface of the sealing resin layer. At least one of the plurality of metal pins may be partially exposed at the side surface of the sealing resin layer and may contact the shield film.

With this configuration, when the metal pins are connected to the ground electrode of the circuit board, grounding of the shield film can be performed through the metal pins.

The radio-frequency module may further include an external terminal whose one end is connected to the one of the main surfaces of the circuit board and whose other end is exposed at the facing surface of the sealing resin layer, and a component mounted on another one of the main surfaces of the circuit board.

With this configuration, a ground electrode of a mother board on which the radio-frequency module is mounted and each of the metal pins can be easily connected, so the shielding characteristics of the metal pins are improved.

The component may have a rectangular shape when viewed in a direction perpendicular to the one of the main surfaces of the circuit board, and each of the plurality of metal pins may be arranged in a state where, when viewed in the direction perpendicular to the one of the main surfaces of the circuit board, a length direction of the second extended portion is oblique to one side of the component.

With this configuration, when viewed in the direction perpendicular to the one of the main surfaces of the circuit board, a shielding function not only in a direction perpendicular to the one side of the component but also in a direction parallel to the one side is ensured by the metal pins.

According to the present disclosure, the plurality of metal pins is disposed near the component to make up a shield member, so the design flexibility of the shield member is improved as compared to the configuration in which a shield film that coats the surface of a sealing resin layer is provided. Since the shield member is made up of the metal pins that are harder and less prone to deform than bonding wires, for example, inconvenience that, when the sealing resin layer is formed, the metal pins deform to contact the component is prevented. Since the metal pins are less prone to deform, the distance between the component and each of the metal pins need not be increased to prevent contact with the component unlike the case where the shield member is made up of bonding wires, so high-density mounting is easy. The space between any adjacent metal pins is also more easily maintained because the metal pins are less prone to deform, so the shielding characteristics become stable.

DETAILED DESCRIPTION

First Embodiment

Figure 1:
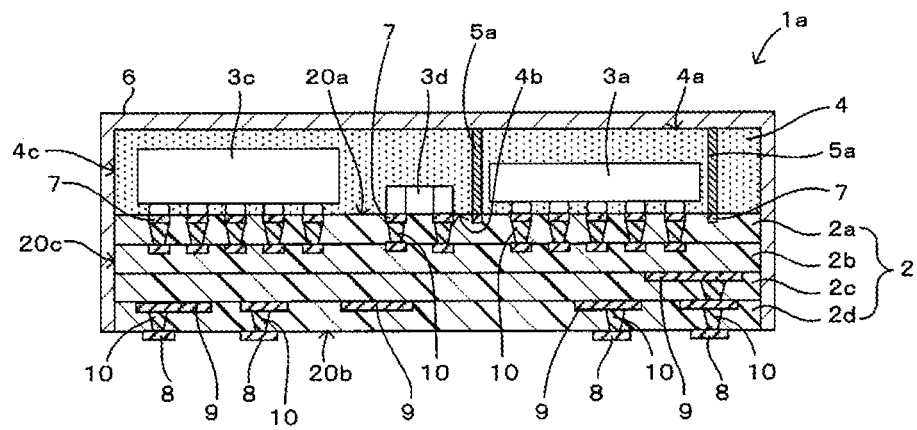
FIG. 1 is a cross-sectional view of a radio-frequency module according to a first embodiment of the present disclosure.
Figure 2:
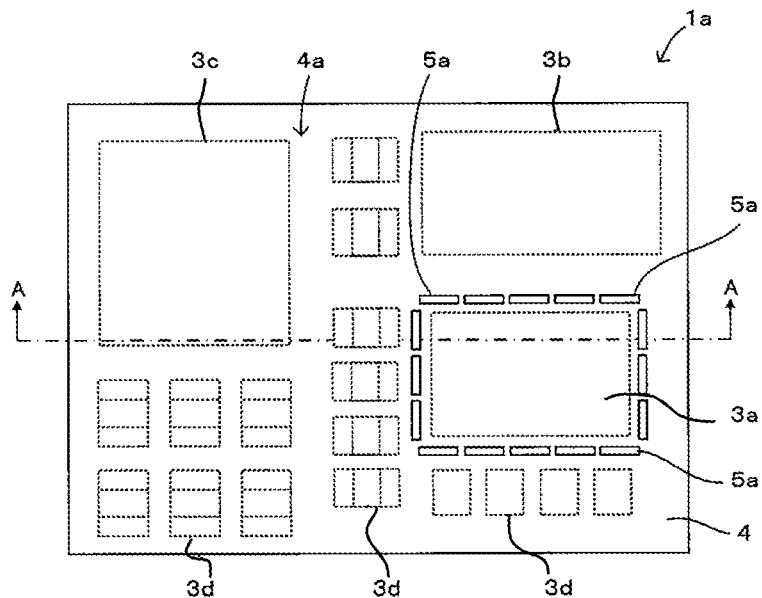
FIG. 2 is a plan view of a state where a shield film of the module of FIG. 1 is omitted.
Figure 3:
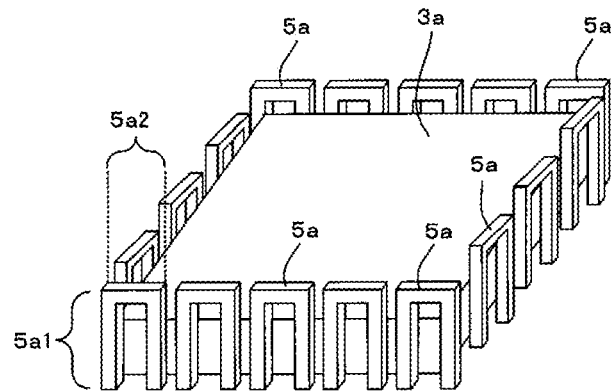
FIG. 3 is a diagram for illustrating metal pins in FIG. 1.

A radio-frequency module 1a according to a first embodiment of the present disclosure will be described with reference to FIG. 1 to FIG. 3. FIG. 1 is a cross-sectional view taken along the line A-A in FIG. 2. FIG. 2 is a plan view of the radio-frequency module 1a in a state where a shield film 6 is omitted. FIG. 3 is a diagram for illustrating metal pins 5a.

As shown in FIG. 1 and FIG. 2, the radio-frequency module 1a according to this embodiment includes a multilayer circuit board 2 (which corresponds to a circuit board of the present disclosure), a plurality of components 3a to 3d, a sealing resin layer 4, a shield film 6, and a plurality of metal pins 5a. The plurality of components 3a to 3d is mounted on a top surface 20a of the multilayer circuit board 2. The sealing resin layer 4 is laminated on the top surface 20a of the multilayer circuit board 2. The shield film 6 coats the surface of the sealing resin layer 4. The plurality of metal pins 5a is mounted on the top surface 20a of the multilayer circuit board 2. The radio-frequency module 1a is, for example, mounted on a mother board, or the like, of an electronic device that uses radio-frequency signals.

The multilayer circuit board 2 is made up of, for example, a plurality of laminated electrically insulating layers 2a to 2d made of low-temperature cofired ceramics, high-temperature cofired ceramics, glass epoxy resin, or the like. Mounting electrodes 7 for mounting the components 3a to 3d and the metal pins 5a are formed on the top surface 20a (which corresponds to one of main surfaces of the circuit board of the present disclosure) of the multilayer circuit board 2. A plurality of outer electrodes 8 for connection to an external device is formed on a bottom surface 20b of the multilayer circuit board 2. Various internal wiring electrodes 9 are formed between any adjacent two of electrically insulating layers 2a to 2d. A plurality of via conductors 10 for connecting the internal wiring electrodes 9 formed on the different electrically insulating layers 2a to 2d is formed in the multilayer circuit board 2. The mounting electrodes 7, the outer electrodes 8, and the internal wiring electrodes 9, each are made of a metal that is generally used as a wiring electrode, such as Cu, Ag, and Al. The via conductors 10 are made of a metal, such as Ag and Cu. Ni/Au plating may be applied to each of the mounting electrodes 7 and each of the outer electrodes 8.

The components 3a to 3d are semiconductor elements, such as an IC and a PA (power amplifier), or chip components, such as a chip inductor, a chip capacitor, and a chip resistor. The components 3a to 3d are mounted on the multilayer circuit board 2 by a general surface mount technology, such as solder bonding.

The sealing resin layer 4 is made of a resin that is generally used as a sealing resin, such as epoxy resin. The sealing resin layer 4 seals the components 3a to 3d and the metal pins 5a. The sealing resin layer 4 has a bottom surface 4b (which corresponds to a contact surface of a sealing resin layer of the present disclosure), a top surface 4a (which corresponds to a facing surface of the sealing resin layer of the present disclosure), and a side surface 4c. The bottom surface 4b contacts the multilayer circuit board 2. The top surface 4a faces the bottom surface 4b.

Each of the metal pins 5a has a shape bent into a square U-shape. Each metal pin 5a is provided upright on the top surface 20a in a state where both end portions are connected to the top surface 20a of the multilayer circuit board 2. Specifically, as shown in FIG. 3, each of the metal pins 5a has two columnar leg portions 5a1 (which correspond to a first extended portion and a third extended portion of the present disclosure), and a columnar connecting portion 5a2 (which corresponds to a second extended portion of the present disclosure). The two columnar leg portions 5a1 are disposed substantially parallel to each other. The columnar connecting portion 5a2 connects end portions of these columnar leg portions 5a1. The columnar connecting portion 5a2 is disposed in a direction perpendicular to both the columnar leg portions 5a1, so the metal pin 5a is formed in a square U-shape. Each of the metal pins 5a is provided upright on the top surface 20a of the multilayer circuit board 2 in a state where end surfaces of the end portions of both of the columnar leg portions 5a1 (end portions on the opposite sides from the end portions that are connected to the columnar connecting portion 5a2), which are the end portions of the metal pin 5a, are connected to the mounting electrodes 7 on the top surface 20a of the multilayer circuit board 2. Therefore, in a state where the metal pins 5a are mounted on the top surface 20a of the multilayer circuit board 2, both the columnar leg portions 5a1 are disposed in a direction substantially perpendicular to the top surface 20a of the multilayer circuit board 2, and the columnar connecting portion 5a2 is disposed in a direction substantially parallel to the top surface 20a. The metal pins 5a are mounted on the multilayer circuit board 2 by, for example, solder. For example, when a multilayer circuit board is a printed circuit board, the metal pins 5a may be inserted in holes for through-hole conductors, formed in the printed circuit board.

When viewed in a direction perpendicular to the top surface 20a of the multilayer circuit board 2 (hereinafter, which may be referred to as plan view), the metal pins 5a are arranged around the component 3a to surround the component 3a. At this time, as shown in FIG. 2, the metal pins 5a are disposed along the sides of the component 3a having a rectangular shape in plan view. At this time, when viewed in plan, the metal pins 5a are arranged in a row around the component 3a in a state where the columnar connecting portion 5a2 of each metal pin 5a is disposed parallel to the adjacent side of the component 3a (see FIG. 2). The metal pins 5a are sealed by the sealing resin layer 4 in a state where the columnar connecting portions 5a2 are exposed from the top surface 4a of the sealing resin layer 4.

The mounting electrodes 7 that are connected to the metal pins 5a are connected to ground electrodes (internal wiring electrodes 9) formed in the multilayer circuit board 2. Thus, the metal pins 5a are grounded.

Each metal pin 5a is formed by, for example, shearing a wire made of a metal material that is generally used as a wiring electrode, such as Cu, Au, Ag, Al, and a Cu-based alloy, into a predetermined length and then bent into a square U-shape. When the wave length of a usage signal is λ, the distance (space) between columnar leg portions 5a1 of each metal pin 5a and the space between the facing two columnar leg portions 5a1 of any adjacent metal pins 5a can be less than or equal to ¼λ. With this configuration, the shielding characteristics of the metal pins 5a for the component 3a improve.

The shield film 6 coats the surface (top surface 4a and side surface 4c) of the sealing resin layer 4 and a side surface 20c of the multilayer circuit board 2. On the top surface 4a of the sealing resin layer 4, the columnar connecting portion 5a2 of each metal pin 5a and the shield film 6 contact each other and are connected to each other. The shield film 6 is connected to the ground electrodes (not shown) exposed at the side surface 20c of the multilayer circuit board 2.

The shield film 6 may have a multilayer structure having an adhesion film, an electrically conductive film, and a protective film. The adhesion film is laminated on the top surface 4a of the sealing resin layer 4. The electrically conductive film is laminated on the adhesion film. The protective film is laminated on the electrically conductive film. The adhesion film is provided to enhance the strength of adhesion between the electrically conductive film and the sealing resin layer 4. The adhesion film may be made of, for example, a metal such as SUS. The electrically conductive film is a layer that is in charge of a substantial shielding function of the shield film 6. The electrically conductive film may be made of, for example, a metal that is any one of Cu, Ag, and Al. The protective film is provided to prevent corrosion or damage to the electrically conductive film. The protective film may be made of, for example, SUS. Since the shield film 6 is in contact with the grounded metal pins 5a, the shield film 6 does not always need to be connected to the ground electrodes exposed at the side surface 20c of the multilayer circuit board 2.

Therefore, according to the above-described embodiment, the plurality of metal pins 5a is arranged around the component 3a to make up a shield member, so the design flexibility of the shield member is improved as compared to the configuration in which only the shield film 6 that coats the surface (top surface 4a and side surface 4c) of the sealing resin layer 4 is provided. Since the shield member is made up of the metal pins 5a tougher than bonding wires, for example, inconvenience that, when the sealing resin layer 4 is formed, the metal pins 5a deform to contact the component 3a is prevented. Since the metal pins 5a are less prone to deform than bonding wires, the distance between the component and each of the metal pins 5a need not be increased to prevent contact with the component unlike the case where the shield member is made up of bonding wires, so high-density mounting is easy. The space between any adjacent metal pins 5a is also more easily maintained because the metal pins 5a are less prone to deform, so the shielding characteristics become stable.

Since the columnar connecting portion 5a2 of each metal pin 5a is exposed from the top surface 4a of the sealing resin layer 4, the shield film 6 and the metal pins 5a can be easily connected. The metal pins 5a are connected to the ground electrodes of the multilayer circuit board 2, so grounding of the shield film 6 is easily performed. When the columnar connecting portion 5a2 of each metal pin 5a is exposed from the top surface 4a of the sealing resin layer 4, the area of connection with the shield film 6 is increased as compared to the configuration in which the ground electrodes are exposed at the side surface 20c of the multilayer circuit board 2 and connected to the shield film 6, so the shielding characteristics of the shield film 6 are improved.

As a manner of shielding between mounting components, for example, there is a case where a groove is formed in a sealing resin layer and a shield wall is formed by filling the groove with electrically conductive paste. In this case, when laser light is used to form the groove, a circuit board can become damaged. However, in this embodiment, a shield member is formed by mounting the metal pins 5a on the multilayer circuit board 2, so there is no such damage to the multilayer circuit board 2.

(Modification of Radio-Frequency Module 1a)

Figure 4:
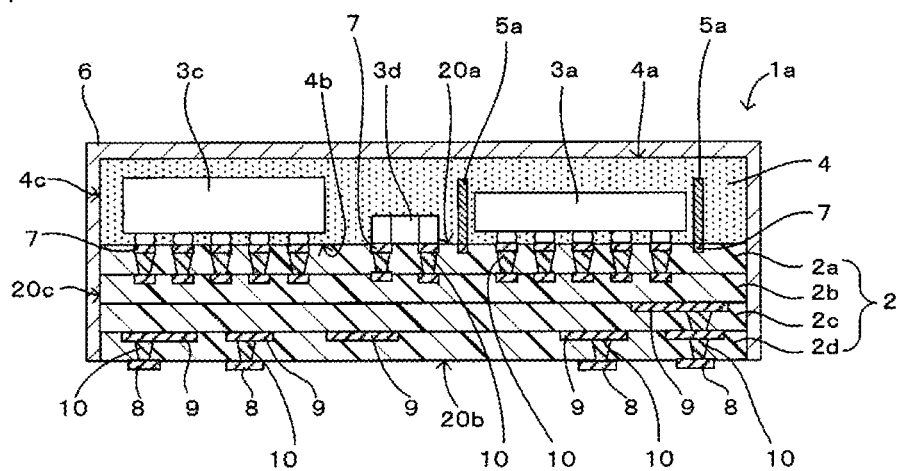
FIG. 4 is a diagram that shows a modification of the radio-frequency module of FIG. 1.

In this embodiment, the columnar connecting portion 5a2 of each metal pin 5a is exposed from the top surface 4a of the sealing resin layer 4. Alternatively, for example, as shown in FIG. 4, the entire portion of each metal pin 5a may be not exposed from any of the top surface 4a and side surface 4c of the sealing resin layer 4, that is, each metal pin 5a may be buried in the sealing resin layer 4.

Second Embodiment

Figure 5:
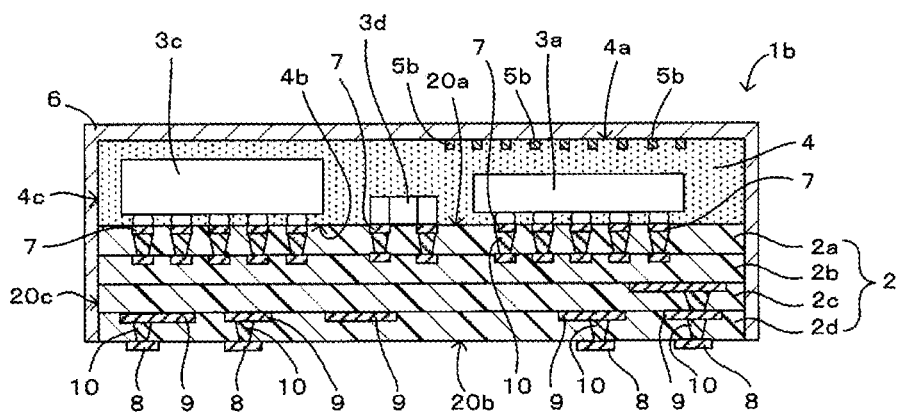
FIG. 5 is a cross-sectional view of a radio-frequency module according to a second embodiment of the present disclosure.
Figure 6:
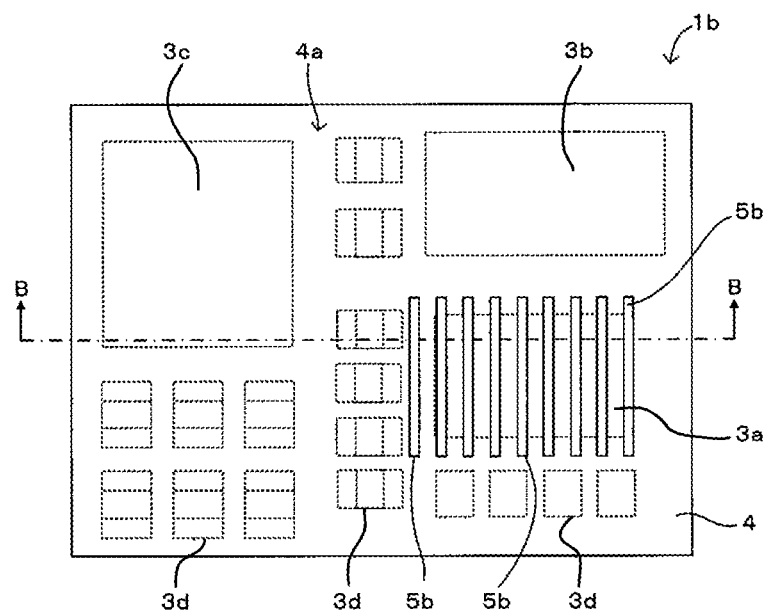
FIG. 6 is a plan view of the module of FIG. 5 in a state where a shield film is omitted.
Figure 7:
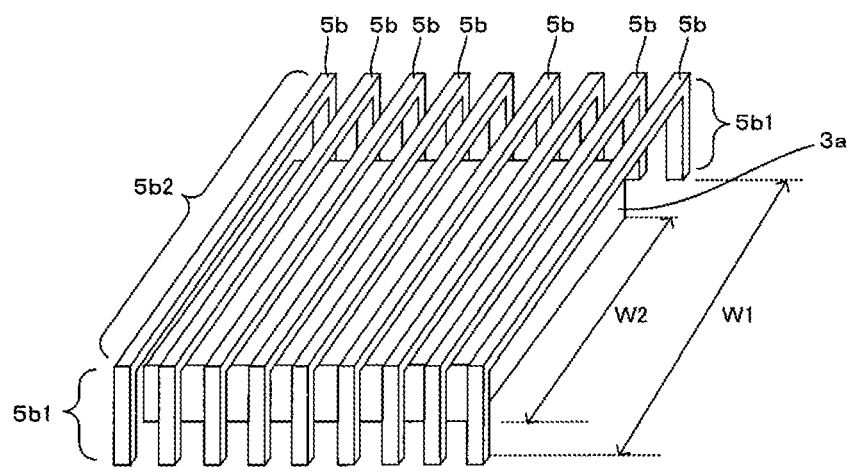
FIG. 7 is a diagram for illustrating metal pins in FIG. 5.

A radio-frequency module 1b according to a second embodiment of the present disclosure will be described with reference to FIG. 5 to FIG. 7. FIG. 5 is a cross-sectional view of the radio-frequency module 1b and is a cross-sectional view taken along the line B-B in FIG. 6. FIG. 6 is a plan view of the radio-frequency module 1b in a state where the shield film 6 is omitted. FIG. 7 is a diagram for illustrating metal pins 5b.

The radio-frequency module 1b according to this embodiment differs from the radio-frequency module 1a of the first embodiment described with reference to FIG. 1 to FIG. 3 in the configuration of the shield member as shown in FIG. 5 to FIG. 7. The remaining configuration is the same as that of the radio-frequency module 1a of the first embodiment, so like reference numerals are assigned, and the description thereof is omitted.

In this case, each metal pin 5b, as well as the metal pin 5a of the first embodiment, is formed in a square U-shape and has two columnar leg portions 5b1 (which correspond to the first extended portion and third extended portion of the present disclosure) and a columnar connecting portion 5b2 (which corresponds to the second extended portion of the present disclosure); however, each metal pin 5b differs from the metal pin 5a of the first embodiment in the space between the columnar leg portions 5b1. Specifically, as shown in FIG. 7, the length of the columnar connecting portion 5b2 of each metal pin 5b is adjusted such that the space W1 (which corresponds to a space between the first extended portion and the third extended portion of the present disclosure) between both the columnar leg portions 5b1 is wider than the width W2 of the component 3a, and each metal pin 5b is disposed to straddle over the component 3a. When viewed in a direction perpendicular to the top surface 20a of the multilayer circuit board 2, the columnar connecting portions 5b2 of the metal pins 5b are parallel to one another and are arranged in a long-side direction of the component 3a at substantially equal spaces. The space between the columnar connecting portions 5b2 in this case is desirably less than or equal to ¼λ when the wave length of a usage signal is λ.

With this configuration, in addition to the advantageous effects of the radio-frequency module 1a of the first embodiment, the component 3a is surrounded by the columnar leg portions 5b1 and columnar connecting portions 5b1 of the metal pins 5b2, so the shielding characteristics for the component 3a improve.

(Modification of Radio-Frequency Module 1b)

Figure 8:
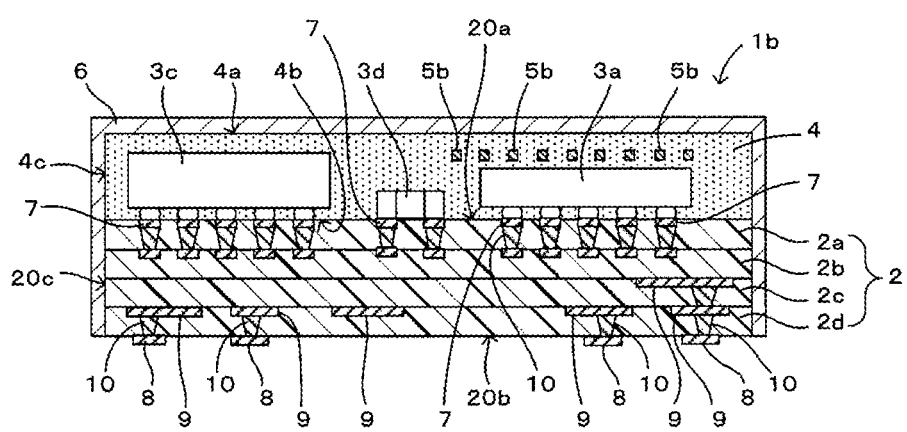
FIG. 8 is a diagram that shows a modification of the radio-frequency module of FIG. 5.

In this embodiment, the columnar connecting portion 5b2 of each metal pin 5b is exposed from the top surface 4a of the sealing resin layer 4. Alternatively, for example, as shown in FIG. 8, the entire portion of each metal pin 5b may be not exposed from any of the top surface 4a and side surface 4c of the sealing resin layer 4, that is, each metal pin 5b may be buried in the sealing resin layer 4. With this configuration, the distance between the component 3a and the columnar connecting portion 5b2 of each metal pin 5b reduces, so the shielding characteristics for the component 3a are improved. The total length (both the columnar leg portions 5b1+the columnar connecting portion 5b2) of each metal pin 5b reduces, so a shield resistance is reduced.

(Modification of Metal Pin 5b)

Figure 9A:
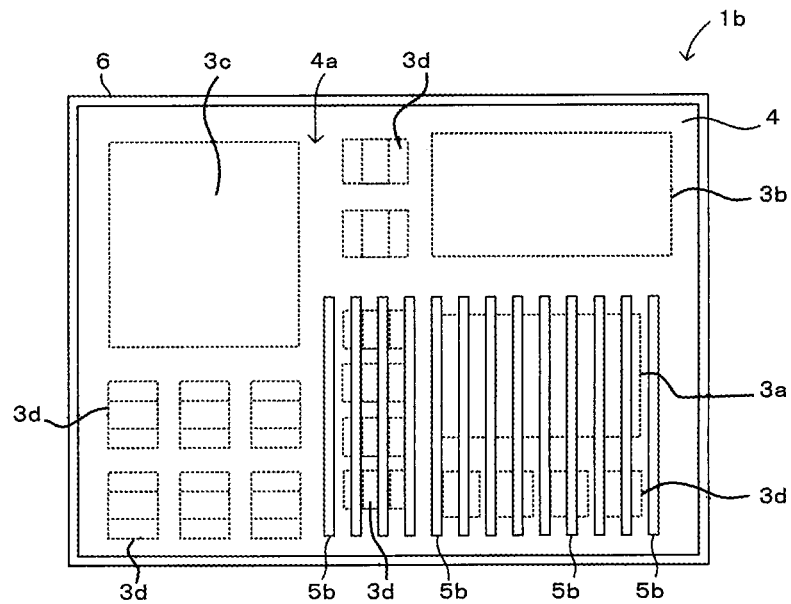
FIGS. 9A and 9B are diagrams that show a modification of the metal pins of the radio-frequency module of FIG. 5.
Figure 9B:
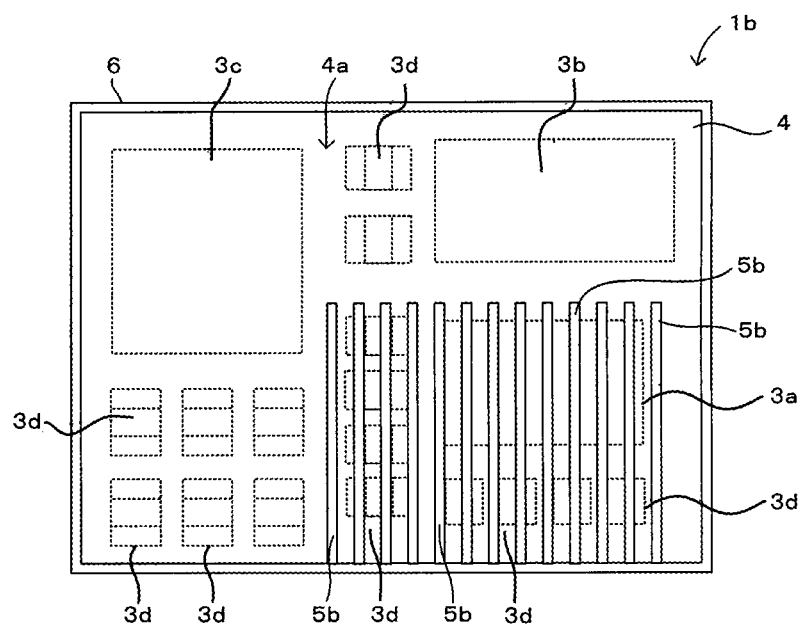

In this embodiment, the case where a shield is made up of the metal pins 5b straddling over only the component 3a is described. Alternatively, for example, as shown in FIG. 9A, the length of each columnar connecting portion 5b2 may be adjusted such that each of the metal pins 5b straddles over the plurality of components 3a, 3d. This configuration is suitable when a predetermined mounting area in which the plurality of components 3a, 3d is mounted is intended to be shielded. Alternatively, as shown in FIG. 9B, one of the columnar leg portions 5b1 of each metal pin 5b may be exposed at the side surface 4c of the sealing resin layer 4 and contact the shield film 6. With this configuration, grounding of the shield film 6 is reliable by the contact between each metal pin 5b and the shield film 6, so the shielding characteristics of the shield film 6 are improved.

Third Embodiment

Figure 10:
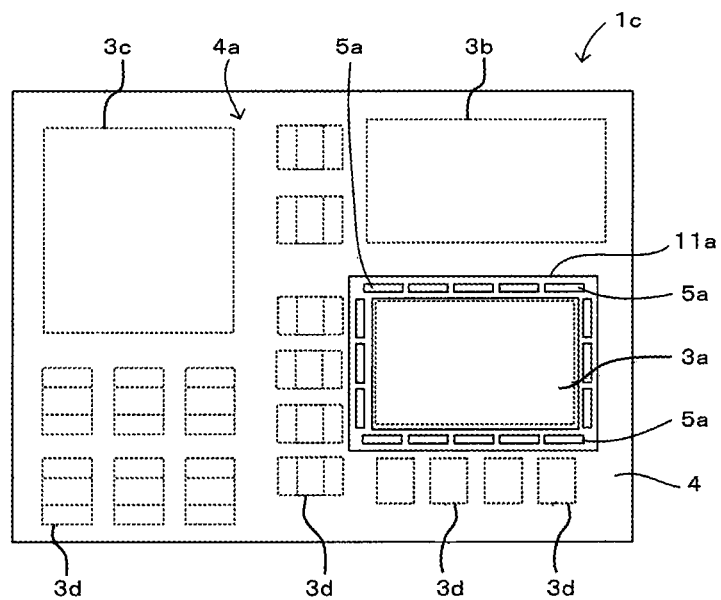
FIG. 10 is a plan view of a radio-frequency module according to a third embodiment of the present disclosure in a state where a shield film is omitted.

A radio-frequency module 1c according to a third embodiment of the present disclosure will be described with reference to FIG. 10. FIG. 10 is a plan view of the radio-frequency module 1c in a state where the shield film 6 is omitted.

The radio-frequency module 1c according to this embodiment differs from the radio-frequency module 1a of the first embodiment described with reference to FIG. 1 to FIG. 3 in the configuration of the shield member as shown in FIG. 10. The remaining configuration is the same as that of the radio-frequency module 1a of the first embodiment, so like reference numerals are assigned, and the description thereof is omitted.

In this case, the metal pins 5a are fixed by a resin mold body 11a made from a thermoplastic resin or a thermosetting resin. Therefore, the metal pins 5a are integrated in a state of being coated with resin. The shape of the resin mold body 11a in plan view is a hollow rectangular shape. The inner edge of the resin mold body 11a is formed in a rectangular shape slightly larger than the component 3a so that the component 3a can be disposed in the hollow portion.

With this configuration, contact between each metal pin 5a and the component 3a is reliably prevented. Since no margin for preventing contact between each metal pin 5a and the component 3a is required, the mounting density of the components 3a to 3d is improved.

Fourth Embodiment

Figure 11:
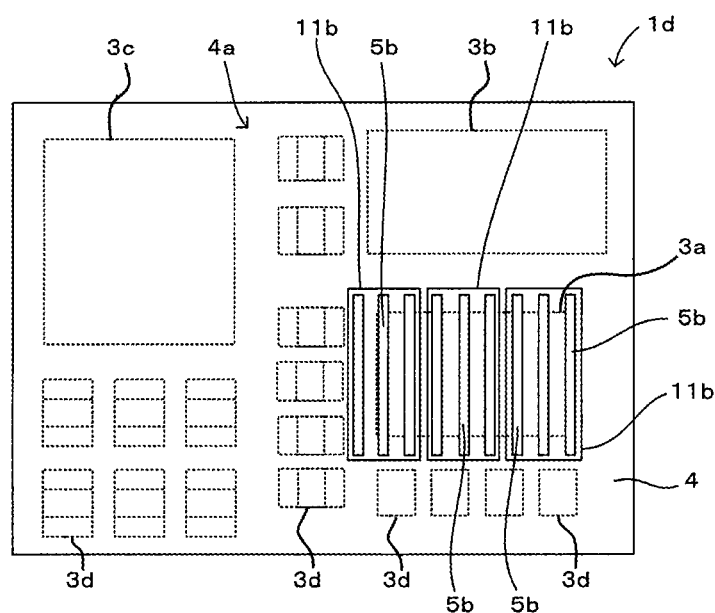
FIG. 11 is a plan view of a radio-frequency module according to a fourth embodiment of the present disclosure in a state where a shield film is omitted.

A radio-frequency module 1d according to a fourth embodiment of the present disclosure will be described with reference to FIG. 11. FIG. 11 is a plan view of the radio-frequency module 1d in a state where the shield film 6 is omitted.

The radio-frequency module 1d according to this embodiment differs from the radio-frequency module 1b of the second embodiment described with reference to FIG. 5 to FIG. 7 in the configuration of the shield member as shown in FIG. 11. The remaining configuration is the same as that of the radio-frequency module 1b of the second embodiment, so like reference numerals are assigned, and the description thereof is omitted.

In this case, as in the case of the third embodiment, the plurality of metal pins 5b is integrated by being fixed by a resin mold body 11b made from a thermoplastic resin or a thermosetting resin. In this embodiment, each set of the three adjacent metal pins 5b is integrated by the one resin mold body 11b. Each resin mold body 11b has basically a rectangular parallelepiped shape and is recessed for a space in which the component 3a is disposed.

With this configuration, contact between each metal pin 5b and the component 3a is reliably prevented. Since no margin for preventing contact between each metal pin 5b and the component 3a is required, the mounting density of the components 3a to 3d is improved.

Fifth Embodiment

Figure 12:
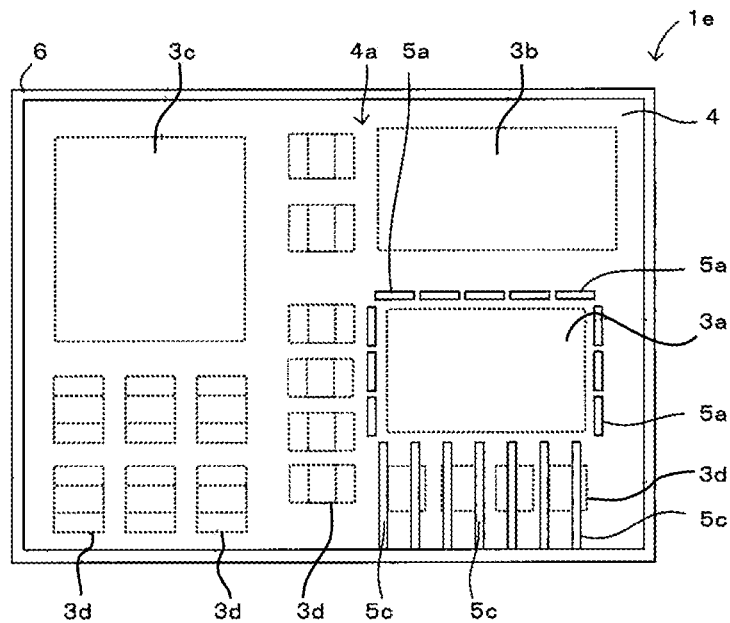
FIG. 12 is a plan view of a radio-frequency module according to a fifth embodiment of the present disclosure in a state where a top surface of a shield film is omitted.

A radio-frequency module 1e according to a fifth embodiment of the present disclosure will be described with reference to FIG. 12. FIG. 12 is a plan view of the radio-frequency module 1e in a state where the top surface of the shield film 6 is omitted.

The radio-frequency module 1e according to this embodiment differs from the radio-frequency module 1a of the first embodiment described with reference to FIG. 1 to FIG. 3 in the configuration of the shield member as shown in FIG. 12. The remaining configuration is the same as that of the radio-frequency module 1a of the first embodiment, so like reference numerals are assigned, and the description thereof is omitted.

In this case, metal pins of both types, that is, the metal pins 5a of the radio-frequency module 1a of the first embodiment and the metal pins 5b of the radio-frequency module 1b of the second embodiment, are disposed in the one radio-frequency module 1e. For example, as shown in FIG. 12, of the metal pins 5a arranged in a row around the component 3a, the metal pins 5a arranged along one of the long sides of the component 3a having a rectangular shape in plan view are removed, and a plurality of metal pins 5c having both a shield portion that is lost as a result of removing the metal pins 5a and a shield portion for the other components 3d adjacent to the one of the long sides is disposed. These metal pins 5c, as well as the metal pins 5b used in the radio-frequency module 1b of the second embodiment, straddle over the components 3d. One of the two columnar leg portions of each metal pin 5c is exposed from the side surface 4c of the sealing resin layer 4 and contacts the shield film 6.

With this configuration, when a component that requires shielding and a component that does not require shielding are mixed, it is easy to shield only the component that requires shielding, so the design flexibility of shielding improves. When part of each metal pin 5c is connected to the shield film 6, the shield film 6 is reliably grounded through a circuit board center-side end portion of the metal pin, so the shielding characteristics of the shield film 6 are improved.

Sixth Embodiment

Figure 13:
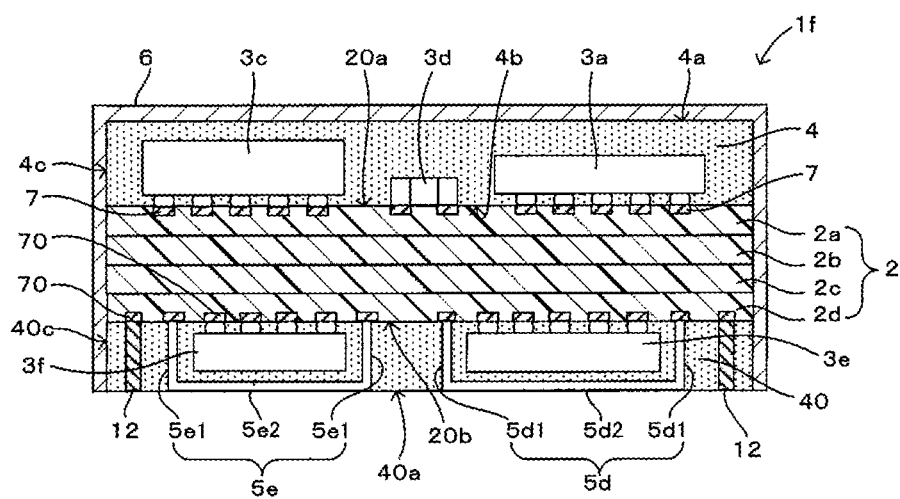
FIG. 13 is a cross-sectional view of a radio-frequency module according to a sixth embodiment of the present disclosure.
Figure 14:
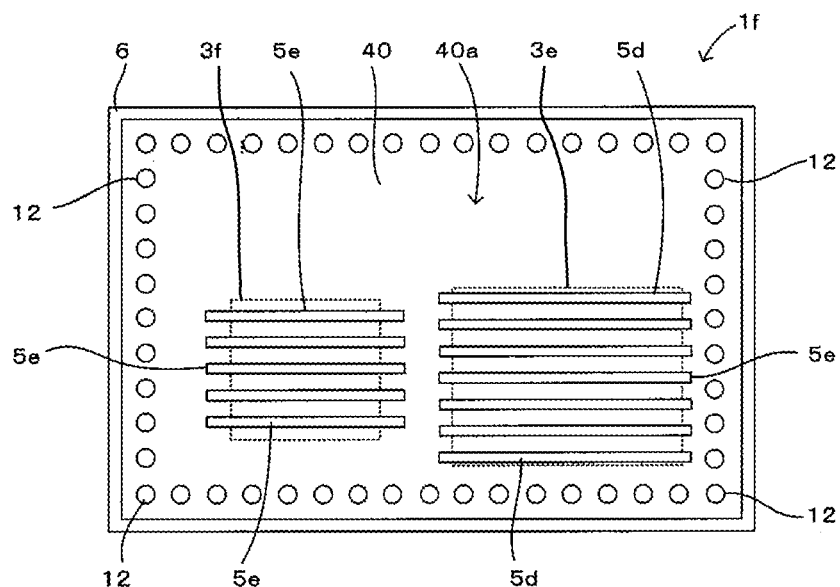
FIG. 14 is a bottom view of the radio-frequency module of FIG. 13.

A radio-frequency module 1f according to a sixth embodiment of the present disclosure will be described with reference to FIG. 13 and FIG. 14. FIG. 13 is a cross-sectional view of the radio-frequency module 1f. FIG. 14 is a bottom view of the radio-frequency module 1f. In FIG. 13, internal wiring electrodes and via conductors formed in the multilayer circuit board 2 are not shown.

The radio-frequency module 1f according to this embodiment differs from the radio-frequency module 1a of the first embodiment, described with reference to FIG. 1 to FIG. 3, in that, as shown in FIG. 13 and FIG. 14, components 3e, 3f are also mounted on a bottom surface 20b of the multilayer circuit board 2 and the configuration of the shield member is different. The remaining configuration is the same as that of the radio-frequency module 1a of the first embodiment, so like reference numerals are assigned, and the description thereof is omitted.

In this case, mounting electrodes 70 are formed on the bottom surface 20b of the multilayer circuit board 2, and the components 3e, 3f are also mounted on the bottom surface side. External connection terminals 12 are further mounted on the bottom surface 20b. The radio-frequency module 1f is connected to an external mother board or the like on the bottom surface 20b side of the multilayer circuit board 2. The components 3e, 3f mounted on the bottom surface 20b of the multilayer circuit board 2 are respectively individually shielded by metal pins 5d and metal pins 5e. The metal pins 5d, 5e, each are of a type to straddle over a component as well as the metal pins 5b of the second embodiment. Columnar connecting portions 5d2 of the metal pins 5d are arranged parallel to one another at substantially equal intervals in a state where each of the metal pins 5d straddles over the component 3e. Columnar connecting portions 5e2 of the metal pins 5e are arranged parallel to one another at substantially equal intervals in a state where each of the metal pins 5e straddles over the component 3f.

A sealing resin layer 40 is also provided on the bottom surface 20b side of the multilayer circuit board 2. The components 3e, 3f, the external connection terminals 12, and the metal pins 5d, 5e are sealed in a state where the lower end surfaces of the external connection terminals 12 and the columnar connecting portions 5d2, 5e2 of the metal pins are exposed from a bottom surface 40a of the sealing resin layer 40. The shield film 6 coats a side surface 40c of the sealing resin layer 40 on the bottom surface 20b side of the multilayer circuit board 2 in addition to the top surface 4a and side surface 4c of the sealing resin layer 4 on the top surface 20a side of the multilayer circuit board 2 and the side surface 20c of the multilayer circuit board 2.

With this configuration, the design flexibility of the shield member for the components 3e, 3f mounted on the bottom surface 20b of the multilayer circuit board 2 is improved. When the columnar connecting portions 5d2, 5e2 of the metal pins 5d, 5e are exposed from the bottom surface 40a of the sealing resin layer 40, the columnar connecting portions 5d2, 5e2 can be directly connected to ground electrodes of a mother board, so the shielding characteristics for the components 3e, 3f mounted on the bottom surface 20b of the multilayer circuit board 2 improve.

Seventh Embodiment

Figure 15:
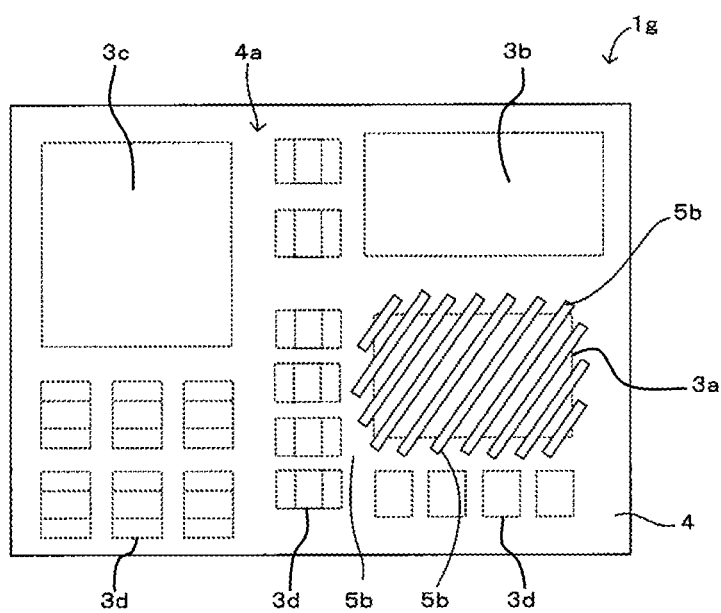
FIG. 15 is a plan view of a radio-frequency module according to a seventh embodiment of the present disclosure in a state where a shield film is omitted.
Figure 16:
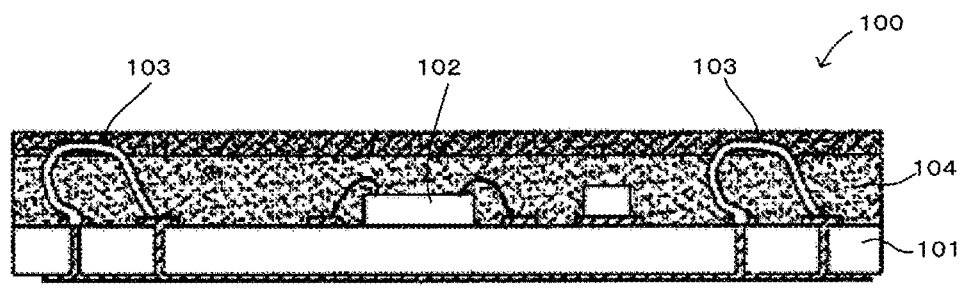
FIG. 16 is a cross-sectional view of an existing radio-frequency module.

A radio-frequency module 1g according to a seventh embodiment of the present disclosure will be described with reference to FIG. 15. FIG. 15 is a plan view of the radio-frequency module 1g in a state where the shield film 6 is omitted.

The radio-frequency module 1g according to this embodiment differs from the radio-frequency module 1b of the second embodiment described with reference to FIG. 5 to FIG. 7 in the arrangement configuration of the metal pins 5b as shown in FIG. 15. The remaining configuration is the same as that of the radio-frequency module 1b of the second embodiment, so like reference numerals are assigned, and the description thereof is omitted.

In this case, when viewed in a direction perpendicular to the top surface 20a of the multilayer circuit board 2, the component 3a has a rectangular shape. The metal pins 5b each straddles over the component 3a. The metal pins 5b are arranged in a state where, as shown in FIG. 15, the length direction of each columnar connecting portion 5b2 is oblique to the long sides (or short sides) of the component 3a.

For example, with the configuration of the second embodiment, when viewed in a direction perpendicular to the top surface 20a of the multilayer circuit board 2, shielding characteristics against noise in a direction perpendicular to the long sides of the component 3a are higher than shielding characteristics against noise in a direction parallel to the long sides of the component 3a. On the other hand, with the configuration of this embodiment, a shielding function is ensured against noise in any of both of these directions, so the mounting flexibility of the radio-frequency module improves.

The present disclosure is not limited to the above-described embodiments. Various modifications other than the above-described ones may be made without necessarily departing from the purport of the present disclosure. For example, some of the configurations of the above-described embodiments and modifications may be combined.

In the above-described embodiments, each of the metal pins 5a to 5e is formed in a square U-shape. Alternatively, for example, each of the metal pins 5a to 5e may be formed in a C-shape or in a rounded U-shape.

In the above-described embodiments, the shield film 6 may be omitted.

The resin mold bodies 11a, 11b are not limited to a resin and just need to be made from an electrically insulating material.

INDUSTRIAL APPLICABILITY

The present disclosure is applicable to various radio-frequency modules including a shield.

REFERENCE SIGNS LIST 1a to 1g radio-frequency module
2 multilayer circuit board (circuit board)
3a to 3f component
4, 40 sealing resin layer
5a to 5e metal pin
6 shield film
12 external connection terminal

The invention claimed is:

1. A radio-frequency module comprising:
a circuit board;
a component mounted on one of main surfaces of the circuit board; and
a plurality of metal pins, each having a first extended portion, a second extended portion, and a third extended portion, one end surface of the first extended portion being connected to an electrode provided on the one of the main surfaces of the circuit board, the first extended portion being extended from the one end surface away from the one of the main surfaces, the second extended portion being bent and extended from one end of the first extended portion on an opposite side from the one end surface, the third extended portion being bent and extended from one end of the second extended portion on an opposite side from the first extending portion to approach the one of the main surfaces, wherein
the plurality of metal pins is disposed around the component to make up a shield member,
a distance between the first extended portion and the third extended portion of each metal pin of the plurality of metal pins is equal to or less than ¼ λ where a wave length of a usage signal of the radio-frequency module is λ, and
for each metal pin of the plurality of metal pins: a distance between the first extended portion of the metal pin and the third extended portion of another one of the plurality of metal pins that is adjacent to the metal pin is equal to or less than ¼ λ.

2. The radio-frequency module according to claim 1, wherein the plurality of metal pins is connected to a ground electrode.

3. The radio-frequency module according to claim 1, wherein the plurality of metal pins is arranged around the component so as to surround the component when viewed in a direction perpendicular to the one of the main surfaces of the circuit board.

4. The radio-frequency module according to claim 1, further comprising:
a sealing resin layer sealing the component, wherein the sealing resin layer has a contact surface that contacts the one of the main surfaces of the circuit board, an opposite surface being opposite to the contact surface, and a side surface connecting an edge of the contact surface and an edge of the opposite surface, and the plurality of metal pins is partially exposed at the opposite surface of the sealing resin layer.

5. The radio-frequency module according to claim 1, further comprising:

a sealing resin layer having a contact surface that contacts the one of the main surfaces of the circuit board, an opposite surface being opposite to the contact surface, and a side surface connecting an edge of the contact surface and an edge of the opposite surface, the sealing resin layer sealing the component and the plurality of metal pins, wherein the plurality of metal pins is not exposed from the opposite surface of the sealing resin layer.

6. The radio-frequency module according to claim 1, wherein each of the plurality of metal pins is coated with an electrically insulating material.

7. The radio-frequency module according to claim 4, further comprising:

a shield film coating at least the opposite surface and the side surface of the sealing resin layer, wherein at least one of the plurality of metal pins is partially exposed at the side surface of the sealing resin layer and contacts the shield film.

8. The radio-frequency module according to claim 4, further comprising:

an external terminal whose one end is connected to the one of the main surfaces of the circuit board and whose other end is exposed at the opposite surface of the sealing resin layer; and a component mounted on another one of the main surfaces of the circuit board.

9. The radio-frequency module according to claim 2, wherein the plurality of metal pins is arranged around the component so as to surround the component when viewed in a direction perpendicular to the one of the main surfaces of the circuit board.

10. The radio-frequency module according to claim 2, wherein each of the plurality of metal pins is configured such that a distance between the first extended portion and the third extended portion is greater than a width of the component and is arranged in a state where each of the plurality the metal pins straddles over the component.

11. The radio-frequency module according to claim 2, further comprising:

a sealing resin layer sealing the component, wherein the sealing resin layer has a contact surface that contacts the one of the main surfaces of the circuit board, an opposite surface being opposite to the contact surface, and a side surface connecting an edge of the contact surface and an edge of the opposite surface, and the plurality of metal pins is partially exposed at the opposite surface of the sealing resin layer.

12. The radio-frequency module according to claim 3, further comprising:

a sealing resin layer sealing the component, wherein the sealing resin layer has a contact surface that contacts the one of the main surfaces of the circuit board, an opposite surface being opposite to the contact surface, and a side surface connecting an edge of the contact surface and an edge of the opposite surface, and the plurality of metal pins is partially exposed at the opposite surface of the sealing resin layer.

13. The radio-frequency module according to claim 2, further comprising:

a sealing resin layer having a contact surface that contacts the one of the main surfaces of the circuit board, an opposite surface being opposite to the contact surface, and a side surface connecting an edge of the contact surface and an edge of the opposite surface, the sealing resin layer sealing the component and the plurality of metal pins, wherein the plurality of metal pins is not exposed from the opposite surface of the sealing resin layer.

14. The radio-frequency module according to claim 3, further comprising:

a sealing resin layer having a contact surface that contacts the one of the main surfaces of the circuit board, an opposite surface being opposite to the contact surface, and a side surface connecting an edge of the contact surface and an edge of the opposite surface, the sealing resin layer sealing the component and the plurality of metal pins, wherein the plurality of metal pins is not exposed from the opposite surface of the sealing resin layer.

15. The radio-frequency module according to claim 1, wherein the second extended portion is parallel to one of four sides of the component when viewed in a direction perpendicular to the main surface of the circuit board.

16. The radio-frequency module according to claim 15, wherein two or more metal pins are disposed along each of the four sides of the component.

17. The radio-frequency module according to claim 15, wherein four or more extended portions including the first extended portions and the third extended portions are disposed along each of the four sides of the component.

* * * * *